United States Patent [19]

Yang

[11] Patent Number: 5,561,634

[45] Date of Patent: Oct. 1, 1996

[54] INPUT BUFFER OF SEMICONDUCTOR MEMORY DEVICE

[75] Inventor: Seung-Kweon Yang, Seoul, Rep. of Korea

[73] Assignee: Lee Patent & Trademark Office, Suwon, Rep. of Korea

[21] Appl. No.: 366,583

[22] Filed: Dec. 30, 1994

[30] Foreign Application Priority Data

Dec. 31, 1993 [KR] Rep. of Korea .................. 31786/1993

[51] Int. Cl.$^6$ ..................................................... G11C 7/00
[52] U.S. Cl. ........................................ 365/189.05; 326/84
[58] Field of Search ......................... 365/189.05; 326/84, 326/81, 85, 86, 110

[56] References Cited

U.S. PATENT DOCUMENTS

5,243,237  9/1993  Khieu ......................................... 326/84

*Primary Examiner*—David C. Nelms
*Assistant Examiner*—F. Niranjan
*Attorney, Agent, or Firm*—Cushman Darby & Cushman, L.L.P.

[57] ABSTRACT

The present invention relates to an input buffer used in semiconductor memory devices and more particularly to an input buffer capable of operating at a high speed by using a BiCMOS (bi-complementary metal oxide semiconductor) circuit. In accordance with the present invention, there is provided an input buffer using a pull-up bipolar transistor and a pull-down bipolar transistor at an output side thereof, including a first device connected between an output terminal of the input buffer and a base of the pull-down bipolar transistor, for charging the base of the pull-down bipolar transistor to a predetermined first level, when potential of an external input signal is changed from a first state to a second state; and a second device connected between the output terminal of the input buffer and the base of the pull-down bipolar transistor, for charging the base of the pull-down bipolar transistor to a predetermined second level, after the potential of the external input signal is changed from a first state to a second state and the first device is at least activated.

18 Claims, 6 Drawing Sheets

INPUT BUFFER OF SEMICONDUCTOR MEMORY DEVICE

BACKGROUND OF THE INVENTION

The present invention relates to an input buffer used in a semiconductor memory device and more particularly to an input buffer capable of operating at a high speed by using a BiCMOS (bi-complementary metal oxide semiconductor) circuit.

Generally, input buffers in semiconductor memory devices, which convert a transistor-transistor logic (TTL) signal received from the exteriors of a chip to a CMOS logic signal, are installed in every input terminal within the chip that receives a plurality of external input signals. One of the problems associated with conventional input buffers is variations variation of an input trip level due to external factors, for example, power supply voltage variation, process condition, and temperature variation, etc. The variation in the input trip level makes the operation speed of the input buffer undesirably low and, more particularly, reduces overall operational speed of BiCMOS memory devices for which high speed operation is desired, for example, BiCMOS static random access memory devices. Further, when the semiconductor memory device is in a stand-by state due to a slight voltage swing of TTL input level, unnecessary power consumption can occur. However, this power consumption problem has been solved by using the input of an inverter positioned in the input side as an activating signal.

Figure 1:
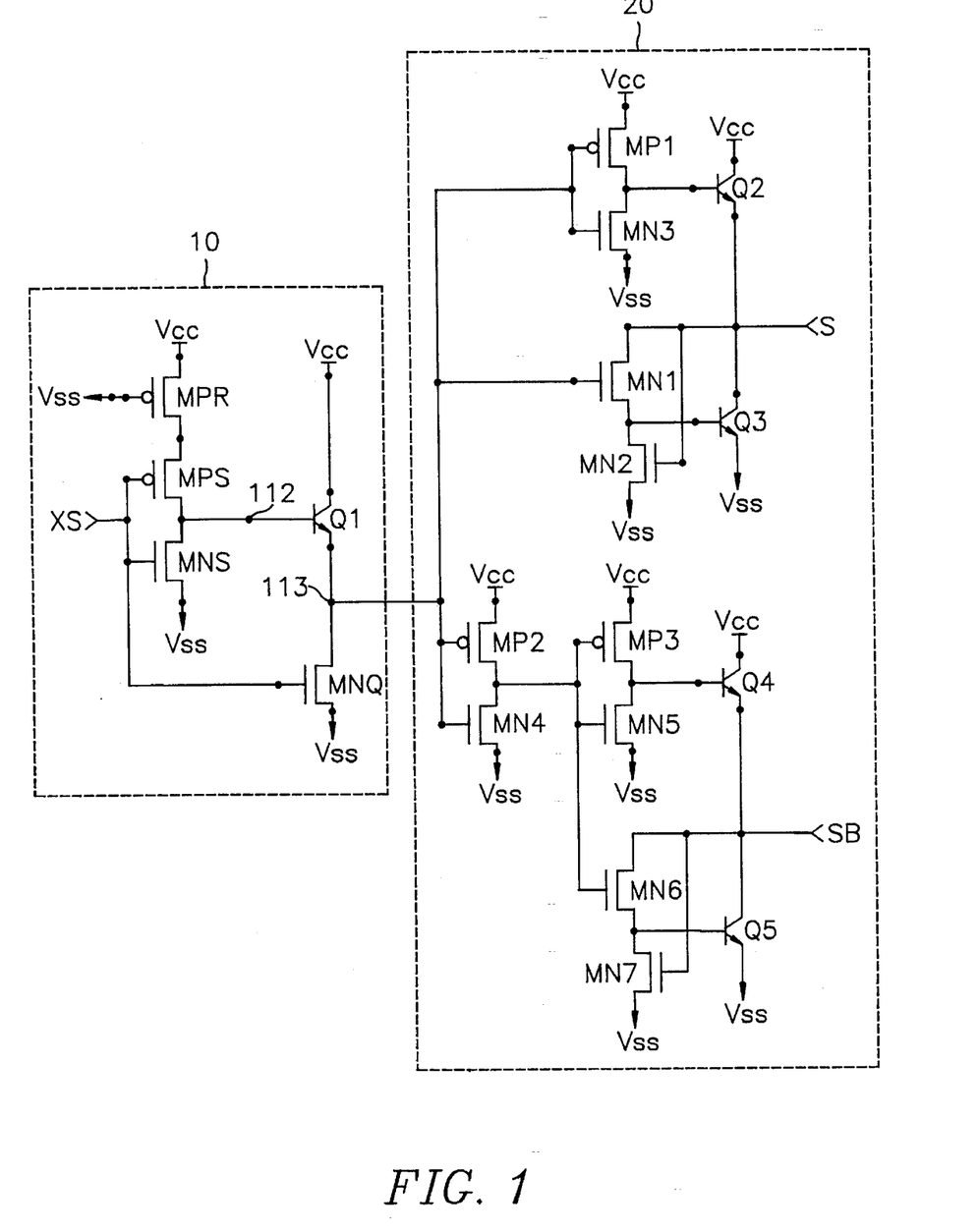
FIG. 1 is a circuit diagram illustrating a conventional input buffer using a BiCMOS circuit.

FIG. 1 is a circuit diagram illustrating a conventional input buffer using a BiCMOS circuit, which is similar to circuit diagrams of U.S. Pat. Nos. 5,047,670 and 5,225,717. A typical input buffer contains two inverters with serial stages, the input buffer of FIG. 1 includes a first stage inverter 10 and a second stage inverter 20. In the first stage inverter 10, a p-channel insulated gate field effect transistor IGFET (hereinafter referred to as p-channel transistor) MPR having a gate connected to substrate potential (or a ground potential) Vss serves to supply a current flowing from the power supply voltage Vcc to a source of p-channel transistor MPS having a gate connected to an external input signal XS. The p-channel transistor MPS and n-channel transistor MNS gated by the external input signal XS have different channel sizes from each other. The external input signal XS substantially has a voltage swing width between 0-3V, while a node 112 (which has a potential in accordance with the gating state of the p-channel transistor MPS and the n-channel transistor MNS, being connected to a base of an npn bipolar transistor Q1) has a voltage swing width between Vcc-0V. The p-channel transistor MPS is susceptible to variation of the power supply voltage, due to its physical characteristic. As a result, the channel width of the p-channel transistor MPS is designed to be smaller than that of the n-channel transistor MNS.

If the external input signal XS is changed from a logic "high" state to a logic "low" state, the p-channel transistor MPS is turned on and the potential in node 112 is at a power supply voltage Vcc level. Thereby, the npn bipolar transistor Q1 is turned on and potential in node 113 of the first stage inverter 10 is at the logic "high" state. If an output signal of the first stage inverter 10 being at the logic "high" state is applied to a gate of n-channel transistor MN1, an npn pull-down bipolar transistor Q3 in the second stage inverter 20 is turned on and an internal signal S is generated in the "low" state. At this time, since a signal being in the logic "low" state is applied to a base of npn pull-up bipolar transistor Q2 using an inverter comprised of a p-channel transistor MP1 and an n-channel transistor MN3, the npn pull-up bipolar transistor Q2 is in a turn-off state. Also, the output signal in the logic "High" state from the first stage inverter 10 is changed to the logic "high" "low" state of an inverter comprised of a p-channel transistor MP2 and an n-channel transistor MN4, and then, respectively applied to an inverter comprised of a p-channel transistor MP3 and an n-channel transistor MN5, and to a gate of an n-channel transistor MN6. Then, since a signal in the logic "high" state is applied to a base of an npn pull-up bipolar transistor Q4, the npn pull-up bipolar transistor Q4 is turned on and a negative phase internal signal SB being in the logic "high" state is generated. At this time, an npn pull-down bipolar transistor Q5 is turned off by the n-channel transistor MN6 being turned off and n-channel transistor MN7 being turned on.

Figure 2:
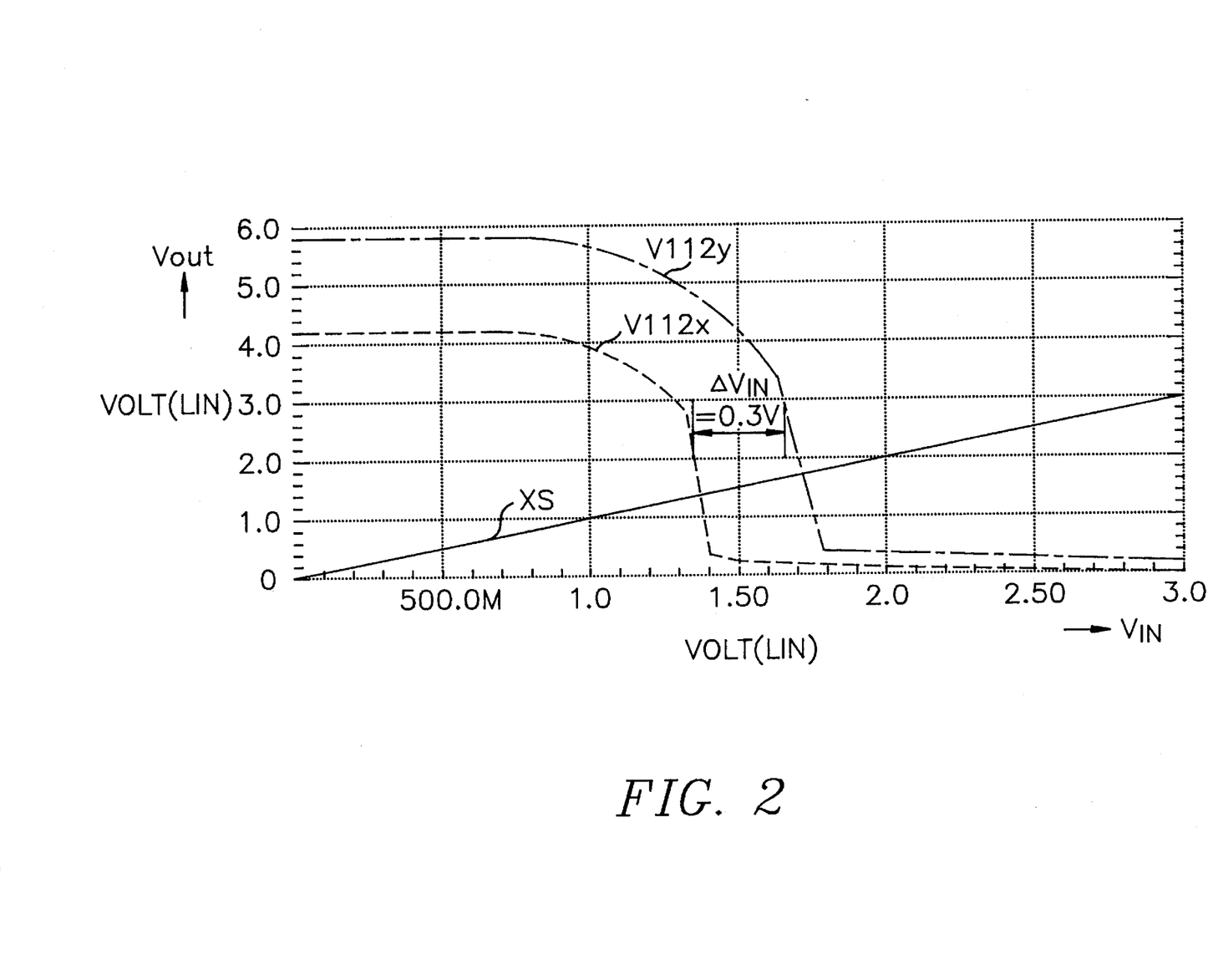
FIG. 2 is a graph illustrating an input voltage characteristic in the conventional input buffer of FIG. 1.

In operation of the conventional input buffer of FIG. 1, a response state in the node 112 to the external input signal XS is changed due to variation of the power supply voltage Vcc level. FIG. 2 is a graph illustrating voltage waveforms in node 112 responsive to the external input signal XS being swung in the voltage between 0V to 3V. The waveform V112x shows a voltage waveform in node 112 responsive to the external input signal XS under the condition (hereinafter referred to as a first condition) of a power supply voltage of 4.2 V and a temperature of 100° C. And the waveform V112y shows a voltage waveform in the node 112 responsive to the external input signal XS under the condition (hereinafter referred to as a second condition) of a power supply voltage of 5.8 V and a temperature of 100° C. In case where the external input signal XS is changed from the logic "high" state to the logic "low" state, if the power supply voltage Vcc is increased, a voltage in the source of the p-channel transistor MPS of FIG. 1 is accordingly increased. As a result, a voltage value $|V_{GS}|$ between the gate and the source of the p-channel transistor MPS is high. Thereby, under the second condition, the potential in the node 112 is in the logic "high" state in potential of 1.6 V before the potential of the external input signal XS falls below 1.5 V. In the first condition, the potential in the node 112 is in the logic "high" state in potential of 1.3 V after the potential of the external input signal XS falls below 1.5 V. As a result, from the waveforms with different power supply voltage Vcc level from each other, it can be appreciated that an intermediate transition voltage level difference ΔVIN in the node 112 (if the logic "high" state is considered as 2.4 V) is approximately 0.3 V.

In case of rising of the power supply voltage (for example. Vcc=5.8 V), the existence of the intermediate transition voltage level difference ΔVIN of 0.3 V enables an input low voltage VIL to be relatively quickly generated in the node 112, and contrarily, in case of falling of the power supply voltage (for example, in case of the first condition), generation of the input low voltage VIL in the node 112 takes considerable. Similarly, when the external input signal XS is changed from the logic "low" state to the logic "high" state, in case of a rising of the power supply voltage, an input high voltage VIH takes considerable time to generate, while, in case of falling of a the power supply voltage, the input high voltage VIH is relatively quickly generated. Such variation of the input high voltage VIH and the input low voltage VIL results in unstable CMOS logic operation in the semiconductor memory device by as much as that of the power supply voltage.

Moreover, in case of rising of a the power supply voltage, the p-channel transistor MPS is designed to have a small channel width compared to the n-channel transistor MNS, in order to adjust the voltage swing widths of the external input signal XS and in the node 112 Accordingly p-channel transistor MPS has a weak current driving capability, and it is understood it takes for the duration that the node 112 to changed to the logic "high" state in response to the external input signal XS is inevitably delayed. Since such an inevitable delay duration is required for all of the external input signals applied to the chip, as shown in the input buffer of FIG. 1, this results in operational speed delays in the semiconductor memory device. For instance, if the external input signal XS is an address signal, time $t_{AA}$ indicative of the period taken from the input of the address signal and the output of data is delayed and in consistently varied due to variation of the power supply voltage level.

SUMMARY OF THE INVENTION

Therefore, an object of the present invention is to provide an input buffer having a stabilized output characteristic against variation of a power supply voltage.

Another object of the present invention is to provide an input buffer capable of considerably reducing variation of an input high voltage and an input low voltage for variation of a power supply voltage.

Yet another object of the present invention is to provide a semiconductor memory device having an input buffer capable of showing a stabilized output characteristic and capable of operating at a high speed against variation of a power supply voltage.

To achieve these and other objects of the present invention, there is provided an input buffer using a pull-up bipolar transistor and a pull-down bipolar transistor at an output side thereof A first device is connected between an output terminal of the input buffer and a base of the pull-down bipolar transistor, for charging the base of the pull-down bipolar transistor to a predetermined first level, when the potential of an external input signal is changed from a first state to a second. A second device is connected between the output terminal of the input buffer and the base of the pull-down bipolar transistor, for charging the base of the pull-down bipolar transistor to a predetermined second level, after the potential of the external input signal is changed from the first state to the second state and the first device is at least activated. A third device is connected between the base of the pull-down bipolar transistor and substrate potential for operating complementability to the second device.

In accordance with the present invention, there can also be provided a power supplier connected between a power supply voltage and the inverter, for supplying power of a constant level to the inverter by the control of a reference voltage depending upon variation of the power supply voltage. Still further, the present invention provides for obtaining.

In accordance with another aspect of the present invention, there is activated. One of the most important effects of the input buffer according to the present invention are in that the transition time needed to obtain an internal signal responsive to the external input signal can be reduced and a stabilized output characteristic is obtained despite variations of the power supply voltage.

BRIEF DESCRIPTION OF THE DRAWINGS

The following is a detailed description of this invention by the reference of the attached drawings, in which like numbers indicate the same or similar elements.

DETAILED DESCRIPTION OF THE PREFERRED EMBODIMENTS

Figure 3:
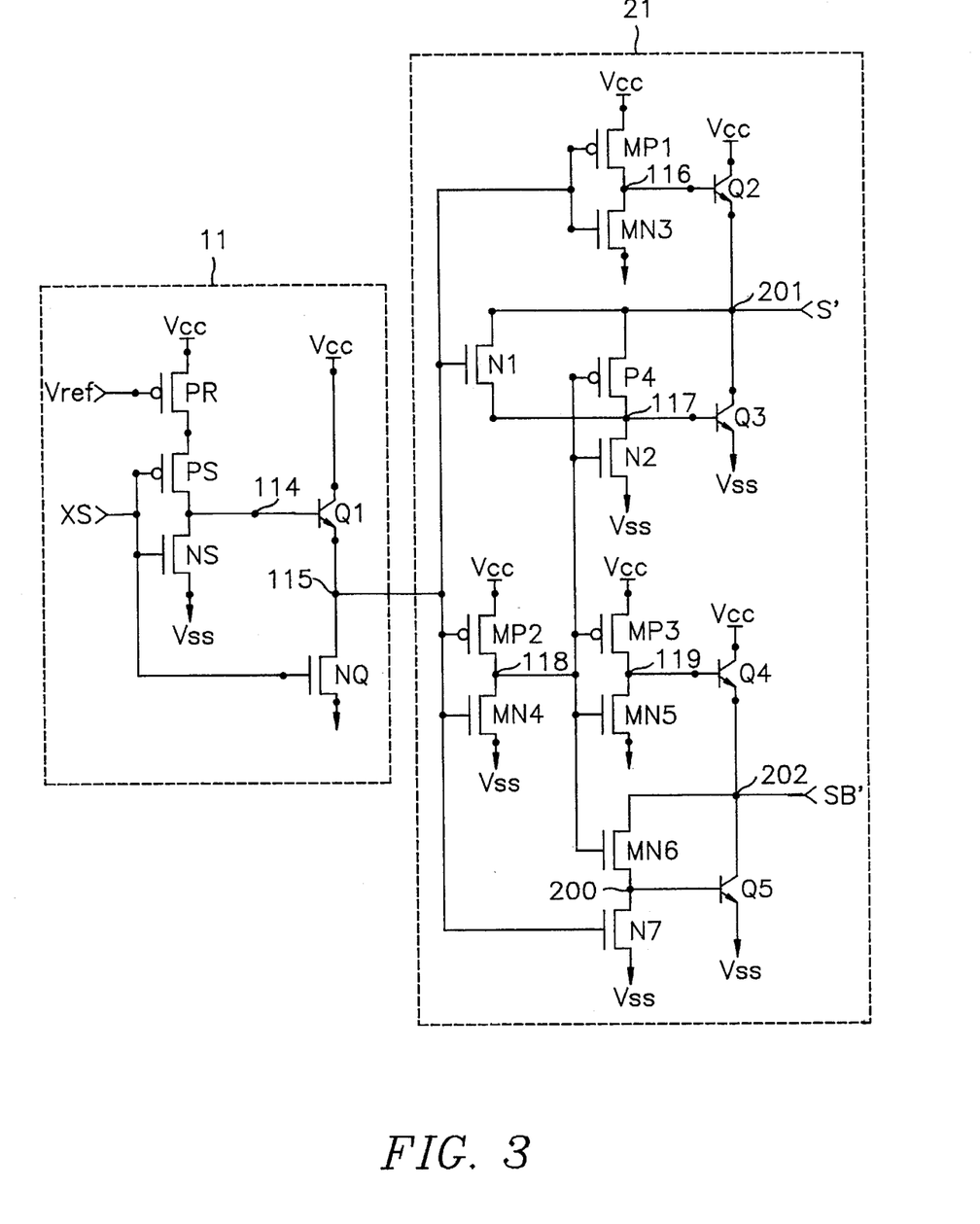
FIG. 3 is a circuit diagram illustrating the input buffer according to the present invention.

FIG. 3 is a circuit diagram illustrating the input buffer according to the present invention. In the figure, the input buffer comprises a first inverter circuit 11 receiving an external input signal XS, and a second inverter circuit 21 receiving a signal generated from an output node 115 of the first inventer circuit 11 and producing an internal signal S' and a negative phase internal signal SB'.

In the configuration of the first inverter circuit 11, a source of a p-channel transistor PR for supplying a constant voltage is coupled to a power supply voltage Vcc, and a gate thereof is coupled to a reference voltage Vref. A source of a p-channel transistor PS coupled to the external input signal XS at a gate thereof is coupled to a drain of the p-channel transistor PR for supplying the reference voltage Vref. A drain of an n-channel transistor NS coupled to the external input signal XS at a gate thereof is coupled to a drain of the p-channel transistor PS and its source is coupled to substrate potential (or ground potential). A node 114 positioned at a common connecting point between the p-channel transistor PS and the n-channel transistor NS is coupled to a base of an npn pull-up bipolar transistor Q1 having a collector coupled to a power supply voltage Vcc. An emitter of the npn pull-up bipolar transistor Q1 is coupled to a first inverter output node 115. A drain of an n-channel transistor NQ having a gate coupled to the external input signal XS is coupled to the first inverter output node 115 and its source is coupled to substrate potential.

The reference voltage Vref supplied to the gate of the p-channel transistor PR for supplying the constant voltage is generated from the reference voltage generator conventionally used in the semiconductor memory device (see U.S. Pat. Nos. 4,906,863 and 4,820,967). The reference voltage Vref has a value dependent on the power supply voltage Vcc level and if the value is approximately $Vcc-2|V_{TP}|$, it may be applicable to the present invention. Since the reference voltage Vref supplied to the gate of the p-channel transistor PR is dependent on the power supply voltage Vcc, a voltage between the gate-source of the p-channel transistor PS maintains a value of $-2|V_{TP}|$ regardless of variation of the power supply voltage. Therefore, the size (or an amount of current) of the voltage supplied to the source of the p-channel transistor PS is constant. As a result, since a voltage in the source of the p-channel transistor PS is less sensitive to the variation of the power supply voltage, there is no need to render the size of the p-channel transistor PS smaller than that of the n-channel transistor NS, like the case of the p-channel transistor MPS in FIG. 1. Accordingly, in order to further reduce the transition time to the logic "high" state in the node 114 than the conventional transition time, the size of the p-channel transistor PS can be designed to have a proper size.

In the configuration of the second inverter circuit 21, an input terminal of a CMOS inverter includes a p-channel transistor MP1 and an n-channel transistor MN3 is coupled to the first inverter output terminal 115. A base of an npn pull-up bipolar transistor Q2 coupled to a power supply voltage Vcc at a collector thereof is coupled to an output terminal 116 (or a base node of the npn pull-up bipolar transistor Q2) of the CMOS inverter. An emitter of the npn pull-up bipolar transistor Q2 is coupled to an internal signal output terminal 201. An emitter of an npn pull-down bipolar transistor Q3 coupled to the internal signal output terminal 201 at a collector thereof is coupled to substrate potential Vss. A gate of an n-channel transistor N 1 having a drain coupled to the internal signal output terminal 201 and having a source coupled to a base node 117 of the npn pull-down bipolar transistor Q3 is coupled to the first inverter output terminal 115. A source-drain passage of a p-channel transistor P4 is coupled between the internal signal output terminal 201 and the base node 117 of the npn pull-down bipolar transistor Q3, and a source-drain passage of an n-channel transistor N2 is coupled between the base node 117 of the npn pull-down bipolar transistor Q3 and substrate potential Vss. Gates of a p-channel transistor P4 and an n-channel transistor N2, which are comprised of a p-channel transistor MP2 and an n-channel transistor MN4, together with gates of a p-channel transistor MP3 and an n-channel transistor MN5 constituting a CMOS inverter, are coupled to an output terminal 118 of the CMOS inverter having an input terminal coupled to the first inverter output terminal 115. An output terminal 119 of a CMOS inverter includes the p-channel transistor MP3 and the n-channel transistor MN5 is coupled to a base of an npn pull-up bipolar transistor Q4 having a collector coupled to a power supply voltage and having an emitter coupled to a negative phase internal output terminal 202. The negative phase internal output terminal 202 is coupled to a collector of an npn pull-down bipolar transistor Q5, and the emitter of the npn pull-down bipolar transistor Q5 is coupled to substrate potential Vss. A drain-source passage of an n-channel transistor MN6 is coupled between the negative phase internal signal output terminal 202 and the base node 200 of the npn pull-down bipolar transistor Q5. The gate of the n-channel transistor MN6 is coupled to the output terminal 118 of the CMOS inverter comprised of the p-channel transistor MP2 and the n-channel transistor MN4. A drain-source passage of an n-channel transistor N7 coupled to the first input output terminal 115 at a gate thereof is coupled between the base node 200 of the npn pull-down bipolar transistor Q5 and the substrate potential Vss.

In the configuration of the above second inverter circuit 21, it should be noted that the structures of the n-channel transistors N1 and N2, p-channel transistor P4, and n-channel transistor N7 are different from the structure of the second stage inverter 20 of FIG. 1. The advantageous operational effect caused by the structure differences of FIG. 1 and FIG. 3 will be discussed hereinafter in detail.

Figure 4:
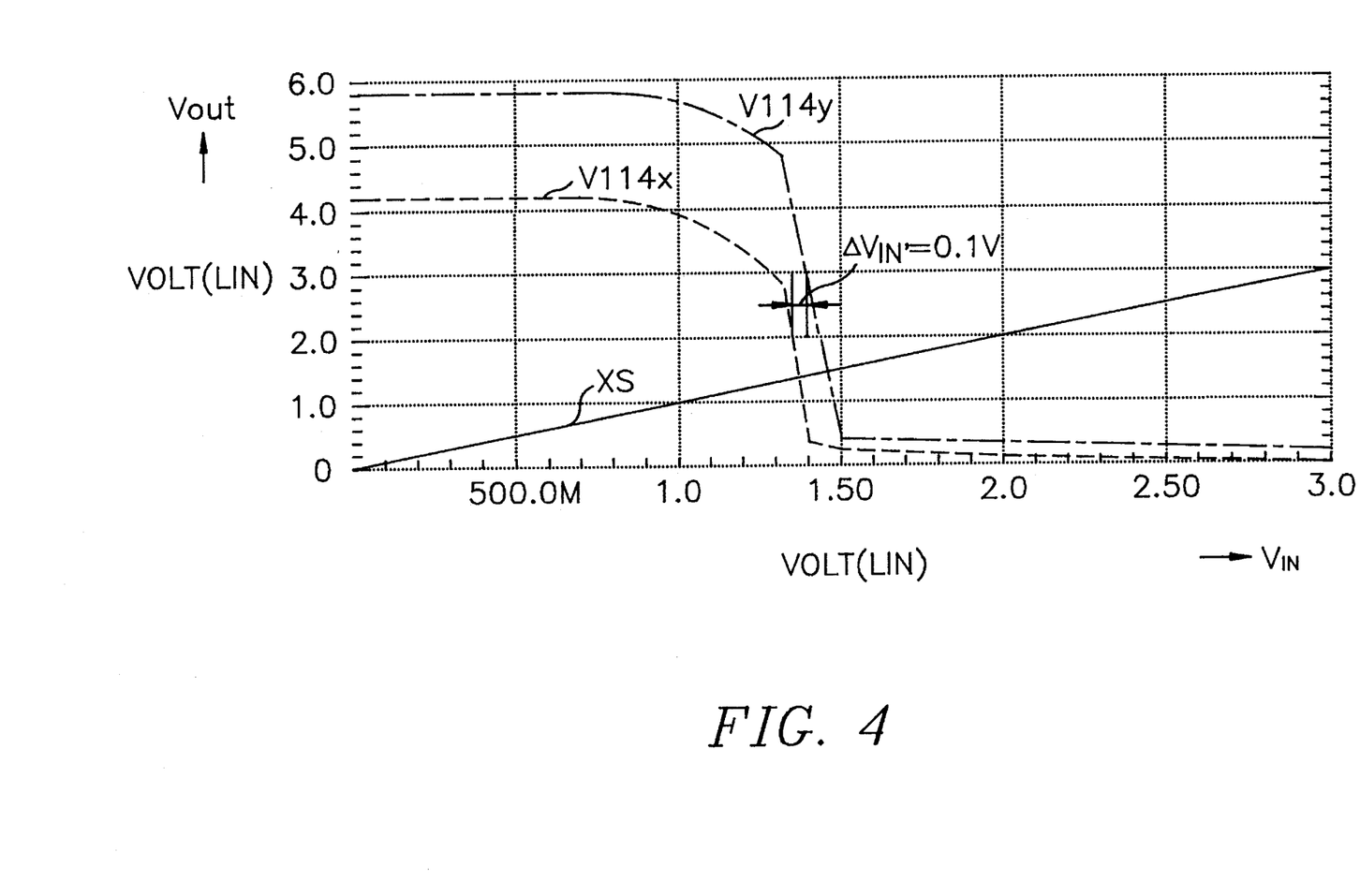
FIG. 4 is a graph illustrating an input voltage characteristic in the input buffer of FIG. 3.

FIG. 4 is provided for showing the operation of the input buffer according to the present invention, wherein potential variations in the node 114 are illustrated when the potential of the external input signal XS falls to 0V from 3V under the same condition as that of FIG. 2 (in case of the power supply voltage of the potential 5.8 V and 4.2 V, under a temperature of 100° C.). A waveform V114x shows potential variation in the node 114 on the first condition as set forth, while a waveform V114y shows potential variation in the node 114 on the second condition as set forth. The potential of the external input signal XS falls to the logic "low" state from the logic "high" state, thus to enable the p-channel transistor PS to be turned on. Thus, the potential of the external input signal XS enabling the potential in the node 114 to be in the logic "high" state is approximately 1.5 V under the second condition, as shown in FIG. 4. In the present invention, the current supplied to the source of the p-channel transistor PS maintains a constant value regardless of the variation of the power supply voltage by applying the reference voltage Vref in the first inverter circuit 11 to the gate of the p-channel transistor PR. Accordingly, the potential of the external input signal XS enabling the potential in the node 114 to be in the logic "high" state is lower by about 1.7 V than that of the external input signal XS enabling the potential in the node 112 0f FIG. 1 to be in the logic "high" state. These results indicate that the time taken until the external input signal XS reaches the node 114 is indicate affected by the power supply voltage Vcc, as compared to the conventional prior art. The intermediate transfer voltage level difference ΔVIN in the node 114 under the first and second conditions is about 0.1 V, which is reduced by ⅓ times when compared to 0.3 V of FIG. 2. This fact suggests that the transition width of input high voltage and input low voltage in accordance with the variation of the power supply voltage is reduced more than that of the conventional prior art.

When the potential in the node 114 goes to the logic "high" state, the npn pull-up bipolar transistor Q1 is turned on, and a first inverter output signal being in the logic "high" state is generated in the first inverter output terminal 115. Since the npn pull-up bipolar transistor Q1 has a current driving capability at a high speed, it is natural that the state that the potential in the first inverter terminal 115 is changed to the logic "high" state should be identical with the transition state in the node 114.

Since the first inverter output signal is in the logic "high" state, the n-channel transistors MN3, MN4, N1 and N7 in the second inverter circuit 21 are turned on and the p-channel transistors MP1 and MP2 are turned off. By the conduction of the n-channel transistor MN3, since a signal being in the logic "low" state is applied to the bade node 116 of the npn pull-up bipolar transistor Q2, the npn pull-up bipolar transistor Q2 is turned off. Also, by the conduction of the n-channel transistor MN4, since the potential in the node 118 is in the logic "low" state, the p-channel transistors P4 and MP3 are turned on, and the n-channel transistors N2, MN5 and MN6 are turned off. The internal signal output terminal 201 in the second inverter circuit 21 directly responds to the first inverter output signal being in the logic "high" state and then is connected to the base node 117 of the npn pull-down bipolar transistor Q3 through the channel of the n-channel transistor N1 being turned on. Thereby, the potential in the internal signal output terminal 201 drops by the amount of the voltage corresponding to a threshold voltage of the n-channel transistor N1 and is then charged to the base node 117 of the npn pull-down bipolar transistor Q3. Here, it is assumed that an initial potential in the internal signal output terminal 201 is in the logic "high" state or in a precharging state. Once the base node 117 is charged through the channel of the n-channel transistor N1, the npn pull-down bipolar transistor Q3 is turned on. As the n-channel transistor N1 is turned on and sequentially the p-channel transistor P4 is turned on, the potential in the internal signal output terminal 201 is all supplied to the base node 117 of the npn pull-down bipolar transistor Q3 through the channel of the p-channel transistor P4, and allows tile npn pull-down bipolar transistor Q3 to be largely turned on. As a result, the potential in the internal signal output terminal 201 drops by a strong positive bias between base-emitter of the Q3 and the internal signal S' is generated in tile logic "low" state. It is appreciated that the n-channel transistor N1 and p-channel transistor P4 function to drop at a high speed the potential in the internal signal output terminal 201. As set forth in the above, in order for the potential in the internal signal output terminal 201 to be rapidly dropped to the logic "low" state, a charging method of the base node 117 of the npn pull-down bipolar transistor Q3 is made by a two stage charging operation performed such that after the n-channel transistor N1 operates in response to the logic "high" state of the first inverter output terminal 115, the p-channel transistor P4 operates in response to the logic "low" state of the node 118. This operation results in the suppression of occurrence of current spikes, or power noise and GND noise due to the rapid transition to the logic "low" state of the internal signal S' as well as due to an abrupt drop of the potential in the internal signal output terminal 201.

If the p-channel transistor MP3 is turned on by the potential in the node 118 being in the logic "low" state, the power supply voltage is charged to the base node 119 of the npn pull-up bipolar transistor Q4 for the negative phase internal signal through the p-channel transistor MP3. Since the potential in the base node 119 is in the logic "high" state, the npn pull-up bipolar transistor Q4 is turned on and the negative phase internal signal SB' being in the logic "high" state is generated in the negative phase internal signal output terminal 202.

In case where the external input signal XS is changed from the logic "low" state to the logic "high" state, the p-channel transistor PS in the first inverter circuit I 1 is turned off and the n-channel transistor NS is turned on. And the pull-up npn bipolar transistor Q1 is turned off and the n-channel transistor NQ is turned on, thereby enabling the potential in the first inverter output terminal 115 to be in the logic "low" state. By this, the p-channel transistors MP1 and MP2 in the second inverter circuit 21 are turned on and the n-channel transistors N1, MN3, MN4 and MN7 are turned off. By the conduction of the p-channel transistor MP1, since the potential in the base node 116 of the pull-up npn bipolar transistor Q2 for the internal signal is in the logic "high" state, the pull-up npn bipolar transistor Q2 is turned on, to generate the internal signal S' being in the logic "high" state. At this time, the p-channel transistor P4 is turned off and the n-channel transistor N2 is turned on by the potential in the node 118 being in the logic "high" state. Also, the pull-up npn bipolar transistor Q3 for the internal signal is turned off.

Since the potential in the base node 119 of the npn pull-up bipolar transistor Q4 for the negative phase internal signal falls to the logic "low" state by the potential in the node 118 being in the logic "high" state, the npn pull-up bipolar transistor Q4 is turned off. Further, the n-channel transistor MN6 responsive to the potential in the node 118 being in the logic "high" state is turned on and the base node 200 of the npn pull-down bipolar transistor Q5 for the negative phase internal signal is charged. Thereby, the npn pull-down bipolar transistor Q5 is turned on, and the negative phase internal signal SB' being in the logic "low" state is generated in the negative phase internal signal output terminal 202.

When the negative phase internal signal SB' is changed to the logic "low" state, it should be noted that the n-channel transistor N7 connected to the substrate potential Vss is previously turned off, responsive to the first inverter output signal being in the logic "low" state, thus enabling the following n-channel transistor MN6 being turned on to operate a stabilized charging operation to the base node 200. In the conventional operation such as a circuit FIG. 1, since the n-channel transistor MN7 of FIG. 1 which performs a similar function to the n-channel transistor N7 of the present invention, is connected to the output terminal of the negative phase internal signal SB at the gate thereof, the n-channel transistor MN7 is turned off after the n-channel transistor MN6 is at least turned on. This operation shows that even if the n-channel transistor MN6 is turned on, some parts of the current which will flow to the base node of the Q5 are still flowing into the substrate through the n-channel transistor MN7 being turned on so far. As a result, it can be appreciated that the operation of the present invention has a more rapid transition time than the convention operation, in performing the operation that the base node of the Q5 is charged and the negative phase internal signal SB' is then changed to the logic "low" state.

Figures 5A, 5B:
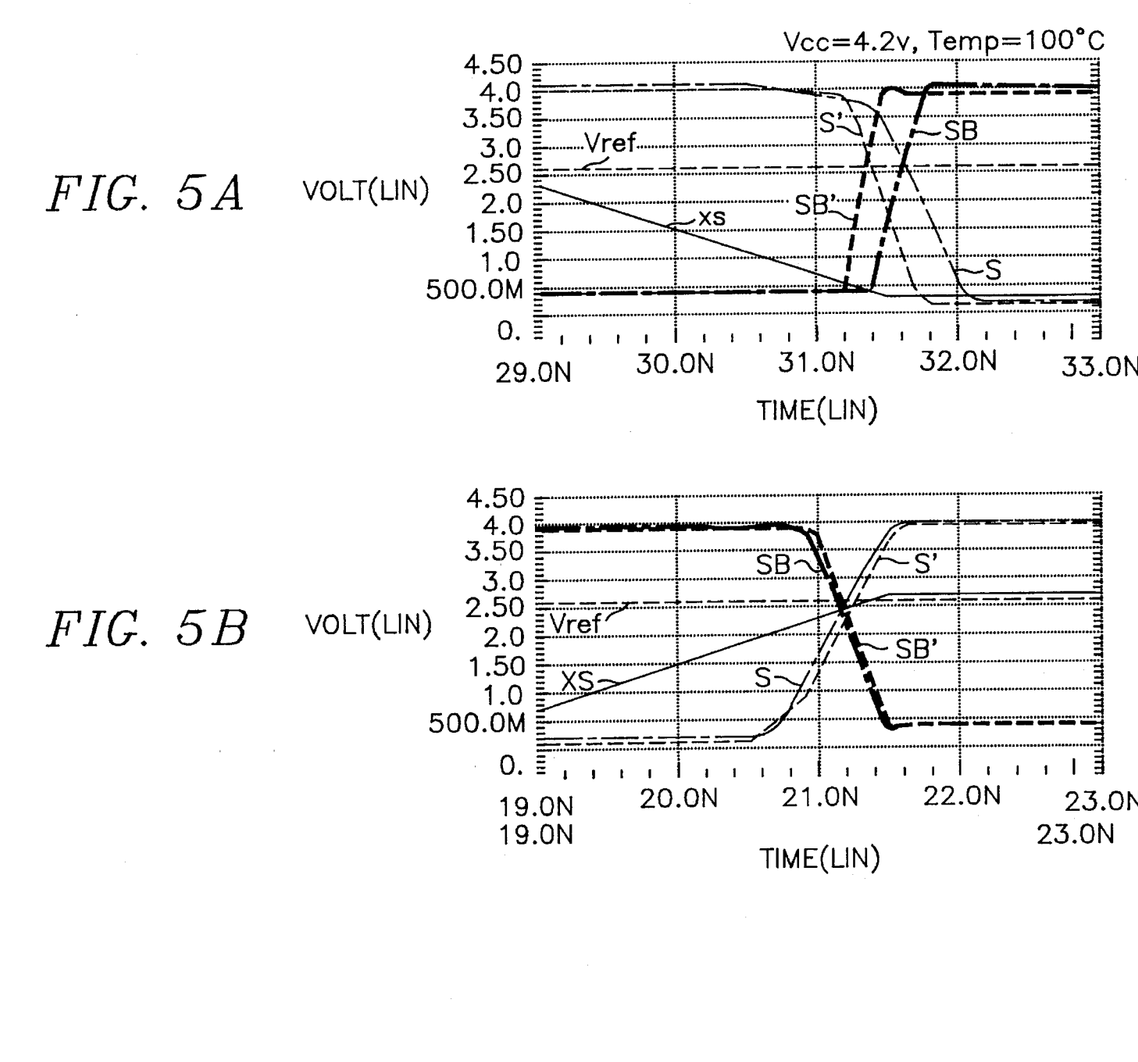
FIGS. 5A and 5B are graphs illustrating comparison of operation speeds between the conventional input buffer and the input buffer according to the present invention, under the condition of a power supply voltage of 4.2 V and a temperature of 100° C.

Referring to FIGS. 5A and 5B, there are shown voltage waveforms obtained by the comparison of the output characteristics of the conventional input buffer and the input buffer according to the present invention, under the first condition as set forth in the above. FIG. 5A shows a case where the potential of the external input signal XS is in a falling state, while FIG. 5B shows a case where the potential of the external input signal XS is in a rising state. In FIG. 5A, the present invention has reduced transition speed difference between the internal signal S' and the negative phase internal signal SB' by about 0.2 ns as compared to the conventional prior art and, thus a has more rapid transition time by about 0.2 ns as compared to the conventional prior art. This result shows that the response time of the input buffer to the external input signal XS is decreased, which is made by a two stage charging operation at a high speed to the base node 117 of the npn bipolar transistor Q3 in the second inverter circuit 21 of FIG. 3. If the external input signal XS is an address signal used in the semiconductor memory device, the time $T_{AA}$ can be reduced. Referring to FIG. 5B showing the potential of the external input signal XS being in the rising state, it is noticed that the transition speed difference between the internal signal S' and the negative phase internal signal SB' is little, but the present invention has a more reduced transition time by about 0.1 ns than the conventional prior art.

Figure 6A:
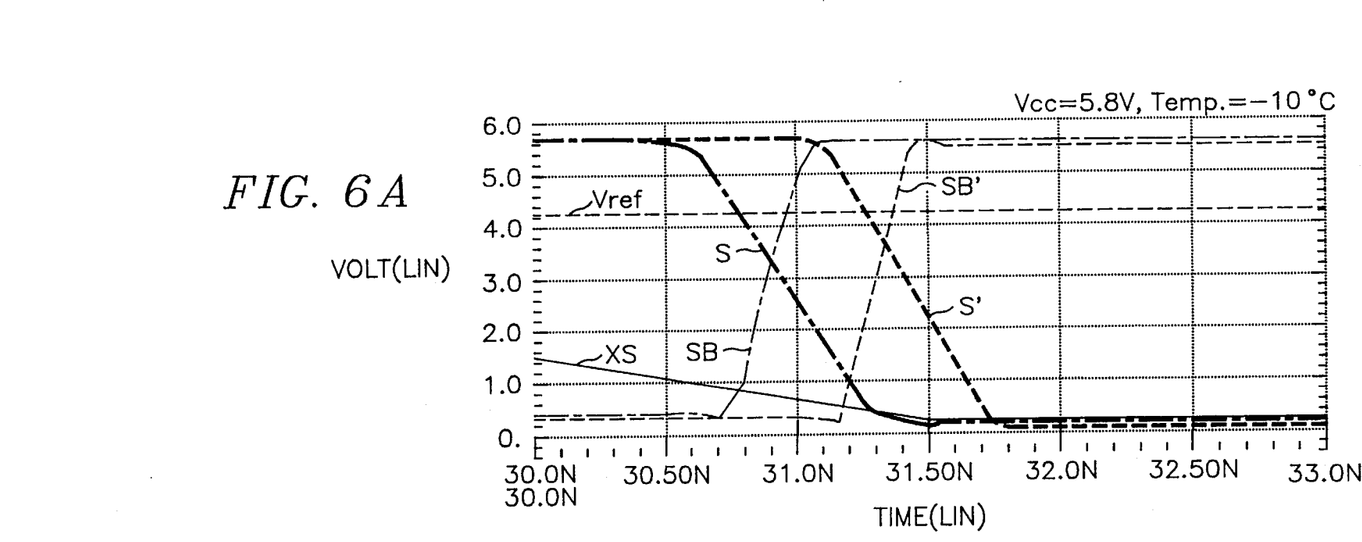
FIGS. 6A and 6B are graphs illustrating comparison of operation speeds between the conventional input buffer and the input buffer according to the present invention, under the condition of a power supply voltage of 5.8 V and a temperature of −10° C.
Figure 6B:
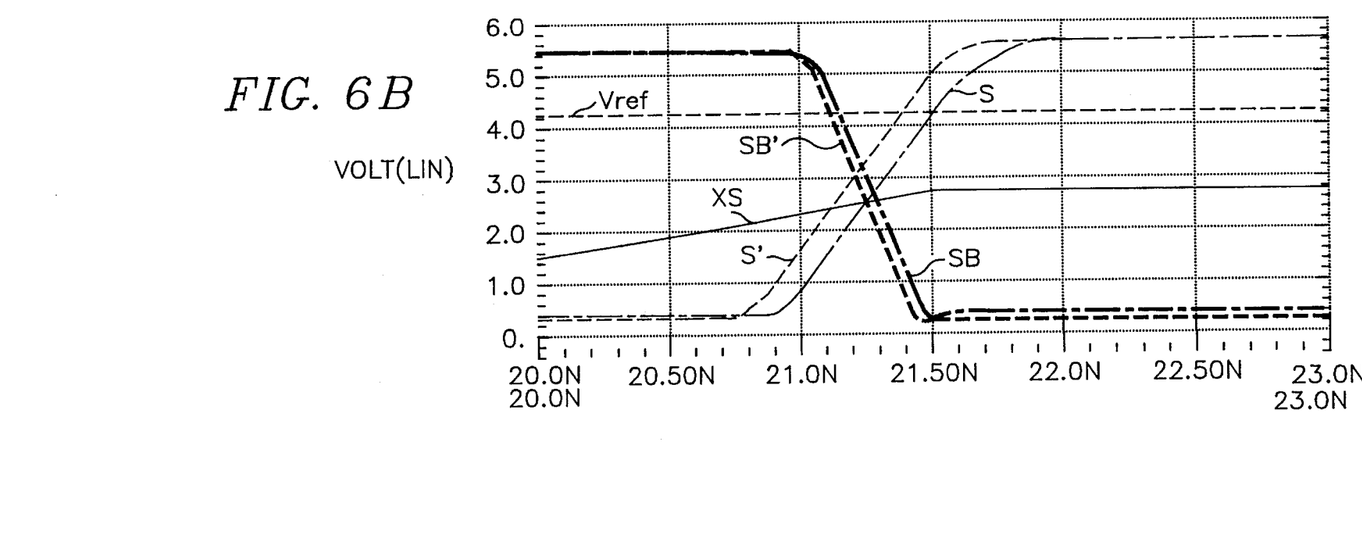

Referring to FIGS. 6A and 6B, there are shown voltage waveforms obtained by the comparison of the output characteristics of the conventional input buffer and the input buffer according to the present invention, under the condition of a power supply voltage of 5.8 V and a temperature of −10°. FIG. 6A shows a case where the potential of the external input signal XS is in a filling state, while FIG. 6B shows a case where the potential of the external input signal XS is in a rising state. In FIG. 6A, the transition time to the logic "low" state of the internal signal S' in the input buffer of the present invention is approximately 0.7 ns, whereas the transition time to the logic "low" state of the internal signal S' in the conventional input buffer is approximately 1 ns, when the potential of the external input signal XS is in the filling state. From this difference, it will be appreciated that the present invention has a reduced transition time of 0.3 ns. Moreover, in FIG. 6A, the present invention has a reduced transition time difference of about 0.1 ns between the internal signal S' and the negative phase internal signal SB', whereas the conventional prior art has a transition time difference of about 0.5 ns therebetween. In FIG. 6B showing the potential of the external input signal XS being in the rising state, it is noticed that the transition time of the present invention to the logic "low" state of the negative phase internal signal SB' is reduced by 0.1 ns when compared to the transition time of the conventional prior art to the logic "low" state of the negative phase internal signal SB.

As discussed above, the input buffer according to the present invention has an advantage of improving its operation stability by suppressing the variation of the transition state of an input voltage in accordance with the variation of the power supply voltage, and of improving an operation speed of a high speed memory device by reducing the transition speed, compared to the conventional art.

In the input buffer according to the preferred embodiment of the present invention, a BiCMOS semiconductor memory device such as, for example, BiCMOS static RAM is applied by using pull-up and pull-down bipolar transistors provided in the output side thereof, but the present invention can be applied to various circuits which require; reducing the transition speed of internal signal or for increasing logic processing speed of an external input signal. For example, even though the input buffer of FIG. 3 is comprised of a common CMOS circuit, not of BiCMOS circuit, configurations of a p-channel transistor PR for supplying a reference voltage, n-channel transistor N1, p-channel transistor P4 and n-channel transistor N7 will be applicable.

What is claimed is:

1. An input buffer using a pull-up bipolar transistor and a pull-down bipolar transistor connected together at an output terminal with an emitter of said pull-up bipolar transistor and a collector of said pull-down bipolar transistor, comprising:

first means connected between said output terminal of said input buffer and a base of said pull-down bipolar transistor, for charging said base of said pull-down bipolar transistor to a predetermined first level, when a potential of an external input signal is changed from a first state to a second state;

second means connected between said output terminal of said input buffer and said base of said pull-down bipolar transistor, for charging said base of the pull-down bipolar transistor to a predetermined second level, after the potential of said external input signal is changed from the first state to the second state and said first means is at least activated; and third means connected between said base of said pull-down bipolar transistor and substrate potential, for operating complimentarily to said second means.

2. The input buffer as claimed in claim 1, wherein said first means has a first drain-source passage coupled between said output terminal and said base and is a first insulated gate field effect transistor (IGFET) having a first gate coupled to a first signal having an inverted logic state as said external input signal.

3. The input buffer as claimed in claim 1, wherein said second means has a source-drain passage coupled between said output terminal and said base and is an insulated gate field effect transistor (IGFET) whose gate is coupled to a signal having the same logic state as said external input signal.

4. The input buffer as claimed in claim 1, wherein said third means has a drain-source passage coupled between said base and said substrate potential and is an insulated gate field effect transistor (IGFET) whose gate is coupled to a signal having the same logic state as said external input signal.

5. An input buffer including an inverter responsive to a potential state of an external input signal, and a pull-up bipolar transistor and a pull-down bipolar transistor connected together at an output terminal with an emitter of said pull-up bipolar transistor and a collector of said pull-down bipolar transistor, said input buffer comprising:

power supplying means connected between a power supply voltage and said inverter, for supplying power of a constant level to said inverter using a reference voltage dependent on variation of said power supply voltage;

first means connected between said output terminal of said input buffer and a base of said pull-down bipolar transistor, for charging said base of said pull-down bipolar transistor to a predetermined first level, when a potential of said external input signal is changed from a first state to a second state;

second means connected between said output terminal of said input buffer and said base of said pull-down bipolar transistor, for charging said base of said pull-down bipolar transistor to a predetermined second level, after the potential of said external input signal is changed from the first state to the second state and said first means is at least activated; and third means connected between said base of said pull-down bipolar transistor and substrate potential, for operating complimentarily to said second means.

6. The input buffer as claimed in claim 5, wherein said power supplying means has a source-drain passage coupled between said power supply voltage and said inverter and is an insulated gate field effect transistor (IGFET) having a gate coupled to said reference voltage.

7. The input buffer as claimed in claim 5, wherein said first means has a first drain-source passage coupled between said output terminal and said base and is a first insulated gate field effect transistor (IGFET) having a first gate coupled to a first signal having an inverted logic state as said external input signal.

8. The input buffer as claimed in claim 5, wherein said second means has a source-drain passage coupled between said output terminal and said base and is an insulated gate field effect transistor (IGFET) whose gate is coupled to a signal having the same logic state as said external input signal.

9. The input buffer as claimed in claim 5, wherein said third means has a drain-source passage coupled between said base and said substrate potential and is an insulated gate field effect transistor (IGFET) whose gate is coupled to a signal having the same logic state as said external input signal.

10. An input buffer including two pairs of output bipolar transistors, one pair provided in an internal signal output terminal and a second pair provided at a negative phase internal signal output terminal in order to transmit an internal signal and a negative phase internal signal having a complementary logic state from each other in response to an external input signal, wherein each pair of output bipolar transistors is comprised of a pull-up bipolar transistor and a pull-down bipolar transistor connected together at respective ones of said output terminals with an emitter of said pull-up bipolar transistor and a collector of said pull-down bipolar transistor, said input buffer comprising:

first means connected between said internal signal output terminal and a base of said pull-down bipolar transistor for said internal signal, for charging said base of said pull-down bipolar transistor for said internal signal to a predetermined first level, when a potential of said external input signal is changed from a first state to a second state;

second means connected between said internal signal output terminal and said base of said pull-down bipolar transistor for said internal signal, for charging said base of said pull-down bipolar transistor to a predetermined second level, after the potential of said external input signal is changed from the first state to the second state and said first means is at least activated;

third means connected between said base of said pull-down bipolar transistor for said internal signal and substrate potential, for operating complimentarily to said second means;

fourth means connected between a base of said pull-down bipolar transistor for said negative phase internal signal and substrate potential, for cutting off a current path to said substrate potential from said base of said pull-down bipolar transistor for said negative phase internal signal, when the potential of said external input signal is changed from the second state to the first state; and fifth means connected between said negative phase internal signal output terminal and said base of said pull-down bipolar transistor for said negative phase internal signal, for charging said base of said pull-down bipolar transistor for said negative phase internal signal, after the potential of said external input signal is changed from the second state to the first state and said fourth means is at least activated.

11. The input buffer as claimed in claim 10, wherein said first means and said fourth means are controlled to be in conductive states, at the same time, by signal having an inverted logic state as said external input signal.

12. The input buffer as claimed in claim 11, wherein said first means has a drain-source passage coupled between said internal signal output terminal and said base of said pull-down bipolar transistor for said internal signal and is an insulated gate field effect transistor (IGFET) having a gate coupled to the signal having said inverted logic state as said external input signal, and said fourth means has a drain-source passage coupled between said base of said pull-down bipolar transistor for said negative phase internal signal and said substrate potential and is an insulated gate field effect transistor (IGFET) having a gate coupled to the signal having said inverted logic state as said external input signal.

13. The input buffer as claimed in claim 10, wherein said third means has a drain-source passage coupled between said base of said pull-down bipolar transistor for said internal signal and said substrate potential and is an insulated gate field effect transistor (IGFET) whose gate is coupled to a signal having the same logic state as said external input signal.

14. The input buffer as claimed in claim 10, wherein said second means and said fifth means are controlled to be in conductive states opposite to each other, at the same time, by a signal having the same logic level as said external input signal.

15. The input buffer as claimed in claim 14, wherein said second means has a source-drain passage coupled between said internal signal output terminal and said base of said pull-down bipolar transistor for said internal signal and is an insulated gate field effect transistor (IGFET) having a gate coupled to the signal having the same logic state as said external input signal, and said fifth means has a drain-source passage coupled between said negative phase internal signal output terminal and said base of said pull-down bipolar transistor for said negative phase internal signal and is an insulated gate field effect transistor (IGFET) having a gate coupled to the signal having the same logic state as said external input signal.

16. An input buffer including an inverter responsive to a potential state of an external input signal, and two pairs of output bipolar transistors, one pair provided in an internal signal output terminal and another pair provided in a negative phase internal signal output terminal in order to transmit an internal signal and a negative phase internal signal having a complementary logic state from each other in response to said external input signal, wherein each pair of output bipolar transistors is comprised of a pull-up bipolar transistor and a pull-down bipolar transistor connected together at respective ones of said output terminals with an emitter of said pull-up bipolar transistor and a collector of said pull-down bipolar transistor, said input buffer comprising:

power supplying means connected between a power supply voltage and said inverter, for supplying power of a constant level to said inverter using a reference voltage dependent on variation of said power supply voltage;

first means connected between said internal signal output terminal and a base of said pull-down bipolar transistor for said internal signal, for charging said base of said pull-down bipolar transistor for said internal signal to a predetermined first level, when a potential of said external input signal is changed from a first state to a second state;

second means connected between said internal signal output terminal and said base of said pull-down bipolar transistor for said internal signal, for charging said base of said pull-down bipolar transistor to a predetermined second level, after the potential of said external input signal is changed from the first state to the second state and said first means is at least activated;

third means connected between said base of said pull-down bipolar transistor for said internal signal and substrate potential, for operating complimentarily to said second means;

fourth means connected between a base of said pull-down bipolar transistor for said negative phase internal signal and substrate potential, for cutting off a current path to said substrate potential from said base of said pull-down bipolar transistor for said negative phase internal signal, when the potential of said external input signal is changed from the second state to the first state; and fifth means connected between said negative phase internal signal output terminal and said base of said pull-down bipolar transistor for said negative phase internal signal, for charging said base of said pull-down bipolar transistor for said negative phase internal signal, after the potential of said external input signal is changed from the second state to the first state and said fourth means is at least activated.

17. The input buffer as claimed in claim 2, wherein said second means has a second source-drain passage coupled between said output terminal and said base and is a second insulated gate field effect transistor (IGFET) with a second gate coupled to a second signal having the same logic state as said external input signal and wherein said first insulated gate field effect transistor is of an N-channel type and said second insulated gate field effect transistor is of a P-channel type.

18. The input buffer as claimed in claim 5, wherein said second means has a second source-drain passage coupled between said output terminal and said base and is a second insulated gate field effect transistor (IGFET) with a second gate coupled to a second signal having the same logic state as said external input signal and wherein said first insulated gate field effect transistor is of an N-channel type and said second insulated gate field effect transistor is of a P-channel type.

\* \* \* \* \*

UNITED STATES PATENT AND TRADEMARK OFFICE
CERTIFICATE OF CORRECTION

PATENT NO. : 5,561,634
DATED : October 1, 1996
INVENTOR(S) : Yang

It is certified that error appears in the above-indentified patent and that said Letters Patent is hereby corrected as shown below:

On the title page: Item [73] Assignee: should read

SAMSUNG ELECTRONICS CO., LTD., SUWON-CITY, KYUNGKI-DO, KOREA--

Signed and Sealed this

Eleventh Day of November, 1997

Attest:

BRUCE LEHMAN

Attesting Officer

Commissioner of Patents and Trademarks